US006171693B1

(12) United States Patent
Lubitz et al.

(10) Patent No.: US 6,171,693 B1
(45) Date of Patent: Jan. 9, 2001

(54) STRUCTURES WITH IMPROVED MAGNETIC CHARACTERISTICS FOR GIANT MAGNETO-RESISTANCE APPLICATIONS

(75) Inventors: Peter Lubitz, Great Falls; Konrad Bussmann, Springfield, both of VA (US); Shu-Fan Cheng, Silver Spring, MD (US)

(73) Assignee: The United States of America as represented by the Secretary of the Navy, Washington, DC (US)

( * ) Notice: Under 35 U.S.C. 154(b), the term of this patent shall be extended for 0 days.

(21) Appl. No.: 09/179,095

(22) Filed: Oct. 27, 1998

(51) Int. Cl.[7] .................................................. G11B 5/66
(52) U.S. Cl. .......................... 428/332; 428/336; 428/692; 428/694 T; 428/694 TS; 428/694 TM; 428/900
(58) Field of Search ..................... 428/694 T, 694 TS, 428/694 TM, 692, 900, 336, 332

(56) References Cited

U.S. PATENT DOCUMENTS

| 5,477,482 | 12/1995 | Prinz | 365/129 |
| 5,541,868 | 7/1996 | Prinz | 365/98 |
| 5,900,324 | * 5/1999 | Moroishi et al. | 428/611 |
| 5,968,673 | * 10/1999 | Kobayashi | 478/694 TS |
| 5,968,679 | 10/1999 | Kobayashi et al. | 428/694 TS |

OTHER PUBLICATIONS

PCT Search Report mailed Feb. 14, 2000.

* cited by examiner

*Primary Examiner*—Leszek Kiliman
(74) *Attorney, Agent, or Firm*—Barry A. Edelberg; Amy Loch Ressing

(57) ABSTRACT

A GMR stack has at least two ferromagnetic layers (e.g., CoFe) spaced from each other by a nonferromagnetic layer (e.g., Cu). A layer of a phase-breaking material (such as Ta or a Ta-base alloy) between the nonferromagnetic layer and at least one of the two ferromagnetic layers prevents the undesirable growth of large-grained structures in the ferromagnetic layers.

20 Claims, 2 Drawing Sheets

STRUCTURES WITH IMPROVED MAGNETIC CHARACTERISTICS FOR GIANT MAGNETO-RESISTANCE APPLICATIONS

BACKGROUND OF THE INVENTION

1. Field of the Invention

The present invention relates generally to thin film magnetic structures intended for giant magneto-resistance (GMR) applications and more particularly to such devices including crystalline layers of one or more nonferromagnetic metals alternating with crystalline layers of one or more ferromagnetic metals having closely matched crystalline symmetry.

2. Description of the Background Art

In this description and in the claims that follows, the terms "metal" includes alloys (crystalline and amorphous) and metallic elements.

Using thin film deposition technologies such as magnetron sputtering, a family of thin film structures has recently been developed in which the material resistance is a sensitive function of applied magnetic fields, so called giant magnetoresistance, GMR. Typically, GMR structures include alternating magnetically hard and magnetically soft layers (relative to each other) of 3d transition metals, all having closely matched (i.e., lattice spacings within 2% of each other) face-centered cubic (fcc) symmetry, spaced from each other by intervening layers of Cu (also having fcc symmetry closely matched with the fcc symmetry of the magnetic layers). The magnetically hard and soft layers may be formed of materials which are magnetically hard or magnetically soft compared to each other, or they may be formed of the same materials, with their relative magnetic coercivities being determined by layer thickness. These structures are being researched and optimized for use in a number of applications in a large number of university, government and industrial laboratories. In many applications, the physical vapor deposition of those structures, e.g., by magnetron or ion beam sputtering, results in the growth of large crystal grains. This large grain growth may also occur even if a single magnetic layer is grown on a thick layer of Cu, such as may be used to make electrical connections to the structures. In contrast to the case where grain sizes are less than about 10 nm, the presence of larger grains allows the magnetic materials to manifest their magneto-crystalline anisotropy. This magneto-crystalline anisotropy produces a strong tendency for the magnetic moments to align along local crystallographic directions and hence become less sensitive to the external magnetic fields to which the materials are intended to respond.

Using materials such as Co, NiFe alloys (e.g., Permalloy™), CoFe alloys (usually about 5 to 97 atomic percent Co) and NiCoFe alloys as ferromagnetic layers and with Cu as a spacer between them, structures have been made for which the resistivity can change by up to about 1% per Oe of applied field, with total resistance changes up to 25% (in trilayers; somewhat higher in multiple stacks) for current flow in the film plane, CIP, and even larger values have been reported for current flow perpendicular to the film plane, CPP, for multilayer stacks.

The resistance change is governed mainly by the so-called "spin-valve" effect in which a part of the resistance changes proportionally to the cosine of the angle between the magnetic moments of adjacent layers. Therefore, achievement of a large resistance change requires that the external applied field change the angles of the magnetic moments of some layers with respect to their neighbors from antiparallel to parallel. While very large resistance changes have been realized in multilayer stacks with combinations such as Fe/Cr, Co/Cu, and Fe/Ru, especially, as layer pairs, very large fields are required to realize the maximum effects, so that the percent change per Oe is far below 1 percent. These materials therefore are useful mainly as sensors for large magnetic fields.

As the thickness of the spacer layer, most commonly Cu, is increased in the range of less than 1 to 5 nm, the largest source of this opposition to magnetic alignment, the antiferromagnetic exchange interactions, disappears rapidly, and much smaller fields are required to achieve the magnetic switching, although the size of the GMR effect also decreases somewhat. However, an additional mechanism must often be introduced to achieve the antiparallel high resistance state in low applied fields. If the resistance change for an application can be less than or about 10%, this alignment is often produced by introducing a separate "exchange bias" layer adjacent to one of two magnetic layers. Another method of achieving an antiparallel alignment applicable to multilayer stacks is to introduce Co into half of the layers. This introduction of Co increases the coercivity of that layer relative to compositions with little or no Co, allowing a low field to reverse the low Co layer without affecting the Co rich layer.

Unfortunately, in cases where the thickness of a multilayer GMR stack exceeds about 10 nm, or in other cases where it is desirable to grow the stack onto a pre-deposited thick Cu "buss bar" to provide electrical connection to the magneto-resistor and to provide magnetic switching if needed, an additional complication arises. Because the crystalline grains of the alloys used grow in size rapidly with thickness for useful GMR systems, and this growth continues through the stack, the surfaces become rough and grain sizes rapidly exceed 100 Å. A number of undesirable consequences follow from this mode of growth. The physical roughness increases, which introduces a source of coupling between adjacent layers, commonly referred to as Neel or orange peel coupling. This coupling makes it harder to achieve the antiparallel state in low fields. The roughness also affects and randomizes the details of the magnetization process, especially if the process proceeds by motion of a domain wall. Additionally, this roughness may complicate further processing. Although the physical roughness can be removed by polishing, the large crystal faces can still replicate their crystalline orientation onto the magnetic overlayers, with highly adverse consequences on the magnetic properties and switching behavior of the overlayers. These adverse consequences result mainly from the enhanced magnetocrystalline anisotropy, which has cubic symmetry.

Except for a few carefully selected alloys, the cubic anisotropies in the Fe-Ni-Co ternary system are considerable, having effective anisotropy fields on the order of 1000 Oe in Co and Fe rich alloys. In this system, there is likely to be at best a few lines, in a ternary diagram of compositions for which this anisotropy characterized by an energy/volume, $K_1$, is near zero. Because zero or minimal crystalline anisotropy is desirable for GMR uses, only a few compositions are optimal for GMR use. Hence, the presence of large grains in GMR layers can prevent attainment of useful properties. Fortunately, the composition known as Permalloy™, Py, which is usually given as 80% Ni and 20% Fe, has close to ideal properties in that the isotropic magnetostriction is zero and $K_1$ is small ($2K_1/M_s \sim 5$ Oe). Permalloy™ also has a low value of growth-induced magnetic anisotropy, ~3–4 Oe, which allows it to switch in a few Oe regardless of grain size. However, Py gives only about ½ the resistance change, when using in GMR structures, compared to cobalt-rich alloys. Therefore, Py alloys incorporating slight to large amounts of Co have been explored to take advantage of two desirable properties. The first is larger GMR effects compared to Py without Co. The second desirable property is more subtle: briefly, the large value of growth-induced anisotropy, up to 20 Oe, in fine grained Co rich alloys can produce a coercivity of this size. This coercivity allows a multilayer stack using this material in layers alternating with Py and Cu to be put in its high resistance state by field cycling appropriate to magnetic memory designs.

Unfortunately, in multilayer stacks, because of the large grain size, the high cubic anisotropy of the Co-rich films deleteriously affect GMR performance. Consequently, the resistance changes as a function of applied fields in materials made of these alloys, as compared to Py-based systems, or thin, fine-grained CoFe alloy films, become very broad with the changes extending to much larger fields and the switching becoming rounded. Furthermore, the desired antiparallel state having the highest resistance becomes unattainable at low fields. Also, a very small device, such as a memory element having a magnetic multilayer thickness of about 100 nm, would incorporate only a few crystalline grains. The size, shape and orientation of these few crystalline grains would be highly random. As a result, there would be large variations in magnetic properties from element to element.

SUMMARY OF THE INVENTION

Accordingly, it is an object of this invention to provide multilayer GMR devices having sharp switching characteristics.

It is another object of the present invention to provide multilayer stacks having alternating crystalline layers of at least one ferromagnetic metal and at least one crystalline layer of a nonferromagnetic metal having the same crystalline structure and a closely matched symmetry, in which the at least one ferromagnetic layer includes a large number of crystalline grains.

It is a further object of the present invention to provide multilayer stacks of alternating crystalline layers of at least one ferromagnetic metal and at least one nonferromagnetic metal having the same crystalline structure and a closely matched symmetry, in which the at least one ferromagnetic layer has a fine-grained structure.

These and other objects are accomplished by providing a thin layer of a phase-breaking material (as used herein and in the appended claims, a phase-breaking material is either a material having a crystalline structure different from that of the ferromagnetic and nonferromagnetic layers, or a layer having the same crystalline structure as that of the ferromagnetic and nonferromagnetic layers, but having at least a two percent difference in lattice constant between itself and the ferromagnetic or nonferromagnetic fcc layer grown thereon) between at least some of the alternating layers of the ferromagnetic and nonferromagnetic materials having closely matching crystalline symmetry. The incorporation of at least one of these phase-breaking layers into a multilayer stack suppresses the formation of large grains that would otherwise occur as the result of growing successive layers of materials with closely matched fcc crystalline symmetry (i.e., each layer having lattice spacing within 2 percent of the layer grown thereon) upon each other.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein.

DESCRIPTION OF THE PREFERRED EMBODIMENTS

Figure 1:
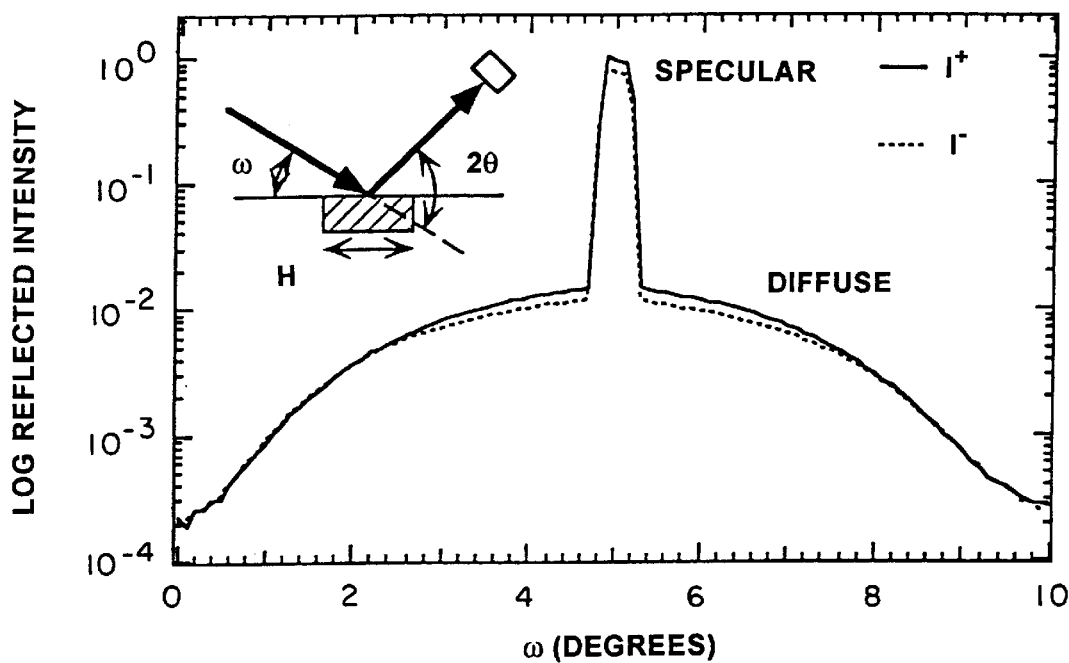
FIG. 1 is the helicity dependant sample rocking curve measured at the Co $L_3$ edge (778 eV) for a detector angel $2\theta=10°$.

A typical device that operates based upon GMR includes layers of ferromagnetic materials with relatively high coercivity (i.e., magnetically hard) alternating with layers of ferromagnetic materials having relatively low coercivity (i.e., magnetically soft) in comparison to the layers of ferromagnetic materials with relatively high coercivity, the hard and soft ferromagnetic layers being spaced from each other by an intervening layer of a nonferromagnetic metal. The magnetically hard and soft ferromagnetic layers used in the present invention may be any ferromagnetic materials commonly used in devices that operate based upon GMR. Typical ferromagnetic layers and their typical thickness have been discussed, for example, in U.S. Pat. No. 5,477,482, issued Dec. 19, 1995, to Gary A. Prinz, the entirety of which is incorporated herein by reference for all purposes. The ferromagnetically hard layer and the ferromagnetically soft layer may be made of the same metals, with their relative coercivities being determine by layer thickness, or of different materials having different coercivities. These ferromagnetic layers have fcc structures which, when arranged in a multilayer stack, have closely matched lattice spacings with the ferromagnetic layers or nonferromagnetic layers they directly contact (or would directly contact in the absence of the phase-breaking layer of the present invention). Typically, the ferromagnetic layer is Fe, Co, Ni, or an alloy thereof (including Permalloy™).

The nonferromagnetic layers used in the multilayer stack of the present invention may be any electrically conductive nonferromagnetic metal with a crystalline structure. As with the ferromagnetic metal, the nonferromagnetic metal typically has a bcc or fcc structure. When used in a multilayer GMR stack, the nonferromagnetic layers have lattice spacings which, in the absence of the inclusion of a phase-breaking layer, are closely matched with the lattice spacings of their adjoining ferromagnetic layers. Typically, the nonferromagnetic layer is an electrically conductive nonferromagnetic metal, e.g., Cu, Pt, Ag, Au and alloys thereof.

Typically, the ferromagnetic layers used in the present invention have the same thicknesses as they have in prior art GMR structures. In most GMR structures, the ferromagnetic and nonferromagnetic layers have thicknesses of from about 20 Å to about 60 Å, and most preferably about 20 Å to about 30 Å.

The phase-breaking layer or layers is grown or otherwise formed or positioned on the surface of at least one of the ferromagnetic or nonferromagnetic layers of the stack. The method by which the phase-breaking layer is positioned or grown or formed on that layer is not critical to the method of the present invention.

Any materials having other a crystalline structure different from that of the ferromagnetic and nonferromagnetic layers, or having the same crystalline structure but a lattice spacing that differs by more than 2% (typically more than 4%, more often more than 8%, and most often more than 10% (based upon the lattice spacing of the phase-breaking layer) from the lattice spacing of the ferromagnetic or nonferromagnetic layer grown thereon and/or supporting it, may be used for the phase-breaking layer in a multilayer stack according to the present invention. Typical phase-breaking materials useful in the present invention include tantalum, tantalum-base alloys, iron and iron-base alloys, Cr and Cr-base alloys, doped or undoped $SiO_2$, semiconductors, and magnetic glasses such as ZrNbCo (which is usually at least 50 at. % Co, typically 80–90 at. % Co, and most often 6–8Zr4–6Nb86–90 Co), ZrCo (which is usually at least 50 at % Co, typically about 80–98 at % Co, and most often 2–7Zr93–98 Co), ZrNiCo which is usually at least 50 at. % Co, typically 80–90 at. % Co, and most often 6–8 Zr4–6 Ni86–90 Co, SiBiCoFe (which has roughly the same proportion of Co to Fe as the CoFe alloy described above, but includes glass-forming amounts of Si and Bi), Zr, Hf, Ti and Ti-base crystalline alloys. While crystalline layers having body-centered cubic (bcc) symmetry are typically useful as the phase-breaking material in the present invention (at least where, as in the usual case, the ferromagnetic and nonferromagnetic layers have an fcc structure), bcc symmetry is not a prerequisite for a phase-breaking layer in the present invention. The use of a phrase-breaking layer with bcc symmetry, however, may facilitate the required growth of additional layers of fcc materials of the multilayer stack thereon.

Because only a thin layer of the phase-breaking material is needed, the resistance of the phase-breaking material is not generally critical. Typically, however, it is desirable that the phase-breaking material be at least semiconducting. More often, the phase-breaking layer has metallic electrical conductivity. For most used, the magnetic properties of the phase-breaking layer are not critical. Thus, the phase-breaking layer may be nonferromagnetic, ferromagnetic, or antiferromagnetic. In most cases, however, the phase-breaking layer has zero, or at least insignificant, magnetostriction. Generally significant magnetostriction is undesirable in a GMR stack, since it can cause the direction of magnetic alignment to change if any non-uniform stress is present. The application of non-uniform stress to a GMR stack during processing is almost inevitable.

The phase-breaking layer must be sufficiently thick to prevent the crystalline orientation of the underlaying substrate layer from significantly influencing the crystalline orientation of the layer to be grown upon the phase-breaking layer. Typically, the phase-breaking layer is at least about 3 Å thick, and is more often at least about 5 Å thick. If the phase-breaking layer is too thick, then the resistivity and magnetic properties of the phase-breaking layer may directly influence the magnetic properties and resistance of the multilayer stack. Where such direct influence is undesirable, the phase-breaking layer is usually no more than about 100 Å thick.

The phase-breaking layer of the present invention may be incorporated anywhere within a multilayered stack including magnetically hard ferromagnetic layers alternating with magnetically soft ferromagnetic layers. While maximum disruption of undesired grain growth is achieved by having a thin phase-breaking layer under each ferromagnetic layer and each nonferromagnetic layer, such maximum disruption is typically not needed, may present an unneeded expenditure of time and money, and may introduce undesirable resistivity as a result of electronic scattering. Generally, the phase-breaking layer is deposited or formed between a nonferromagnetic (e.g., Cu or Cu-base alloy layer) and the adjacent ferromagnetic layer of the multilayer stack. A typical GMR stack according to the present invention, including alternating sets of ferromagnetic and nonferromagnetic films, may have, for example, one phase breaking layer for every four nonferromagnetic layer/(soft or hard) ferromagnetic layer/nonferromagnetic layer/(hard or soft) ferromagnetic layer units in the stack. More or less phase-breaking layers may be used if desired. Also, in a GMR structure built upon a Cu (or similar) buss bar, it is particularly advantageous to have at least one phase breaking layer directly upon the buss bar.

In some cases, such as where Ta is the phase-breaking layer and, Cu is the nonferromagnetic layer, and CoFe is the ferromagnetic layer, it may be advantageous to grow an additional thin layer (typically about 5 Å to about 20 Å thick) of the nonferromagnetic material upon the phase-breaking film. This additional layer can help reestablish the growth of the ferromagnetic layer. If the thickness of the additional layer of nonferromagnetic material is less than about 5 Å, the reestablishment of fcc growth is noticeably decreased. As the thickness of the additional layer (Cu in this case) increases, grain growth may reappear. Therefore, it is advisable to use the minimum needed thickness of any additional layer to reestablish fcc growth.

Having described the invention, the following examples are given to illustrate specific applications of the invention including the best mode now known to perform the invention. These specific examples are not intended to limit the scope of the invention described in this application.

EXAMPLES

Two sets of CoFe alloy thin films, which were prepared by RF sputtering. The samples were grown on nearly atomically flat insulating $Si_3N_4$-coated Si substrates (Roughness~1.5 Å rms) with the following two structures:

Cu(30 Å)/$Co_{95}Fe_5$ (50 Å)/Cu(x Å)/$Si_3N_4$/Si Wafer

Cu(30 Å)/$Co_{95}Fe_5$(50 Å)/Cu(10 Å)/Ta(40 Å)/Cu(x Å)/$Si_3N_4$/Si Wafer

The CoFe alloy composition was selected to reduce magnetic contributions to the strain (i.e. small magnetostriction). Due to growth dynamics, the rms roughness of Cu grown on $Si_3N_4$ increases dramatically as the thickness of the Cu buffer layer, x, is increased. In this way the roughness of the Cu template on which the CoFe layer is grown can be tailored from 4 Å to ~30 Å rms for a Cu buffer thickness ranging from 200 Å to 1600 Å. The Ta layer of the second set of films serves as a phase-breaking layer which effectively reduces the grain size of the subsequently deposited CoFe alloy film. The inclusion of the Ta layer results in a reduction in the chemical correlation length (ξ), which is a measure of grain size, by about 35%.

All of the reflectivity measurements were conducted at the NRL/NSLS Magnetic Circular Dichroism Facility located at beamline U4B of the National Synchrotron Light Source. For these measurements the degree of circular polarization was set to 75% and the energy resolution was 0.8 eV. The experimental chamber consists of a vacuum compatible θ-2θ spectrometer modified to incorporate a Si photo-diode detector to measure the reflected soft x-ray intensity, which is normalized to the incident photon flux. The angular resolution is defined by collimating slits between sample and detector to be approximately 0.5°. The sample is mounted in the gap of an electromagnet that provides fields in the scattering plane of up to ±400 G (see inset of FIG. 1).

Magnetic and chemical roughness information in these structures is probed through helicity dependent sample rocking curves measured at the Co $L_3$ edge (778 eV). It is apparent in FIG. 1 that there is a strong helicity dependence to both the specular and diffuse data as noted by comparing the spectra for photon helicity and magnetic moment aligned ($I^+$) and anti-aligned ($I^-$). Since the magnetic scattering intensity is dependent on the relative orientation between the photon helicity and magnetic moment, following the scattered intensity as a function of applied field can yield a measurement of the magnetic hysteresis. For a given photon incidence angle on FIG. 1, this corresponds to moving between $I^+$ and $I^-$ as the magnetization of the CoFe thin films is driven from magnetic saturation in the positive to negative field direction. For specular reflectivity ($\omega=5°$) this is identical to the Magneto-Optic Kerr Effect (MOKE) (except here soft x-rays are being used) and the bulk hysteretic behavior of the Co bearing thin film is obtained. Interfacial sensitivity is obtained by measuring the field dependent intensity of the diffuse scattering, which by nature originates at the rough CoFe/Cu interface. Measurements at the absorption edge, in addition to being element specific, lead to strong attenuation of x-rays in the CoFe layer. By altering the incident angle of the photon the probing depth can then be controlled introducing a depth selectivity. For these samples, measurements were made at grazing incidence ($\omega<10°$) and thus probe predominately the top CoFe/Cu interface.

Since the incident photon has a wavelength comparable to the film thickness, magnetic interference effects from scattering at different interfaces in a multilayered structure can alter the shape of the hysteresis loops. While at first this seems disadvantageous, these altered loops contain a great deal of information concerning the relative orientation of magnetic layers, which can be used to directly extract the vertical correlation of the magnetic domains in adjacent layers. However, for the case of a single layer CoFe thin film, the hysteresis measured by specular reflectivity is identical to the bulk hysteresis. This was confirmed both by using magneto-optical simulations of the field dependent reflectivity at the $L_3$ edge and by comparing the specular hysteresis loops to those measured by Vibrating Sample Magnetometry (VSM).

Figure 2A:
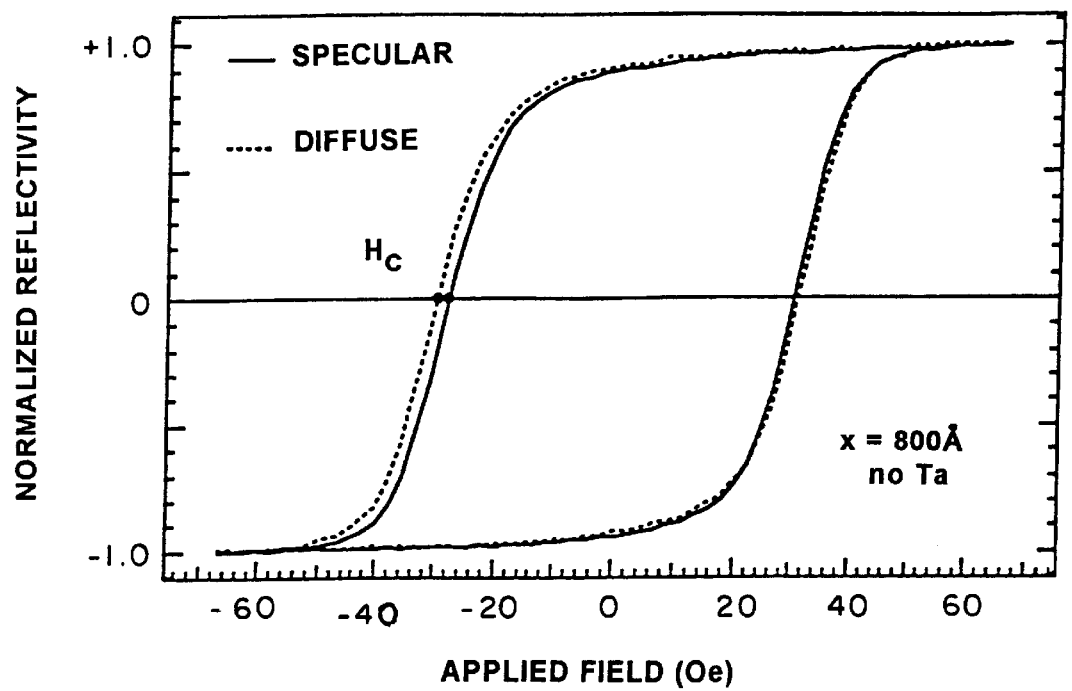
FIG. 2a shows the specular (bulk) and diffuse (interfacial) hysteresis for the 800 Å Cu buffer layer film without a Ta phase-breaking layer taken at the sample angles mentioned in the present specification.
Figure 2B:
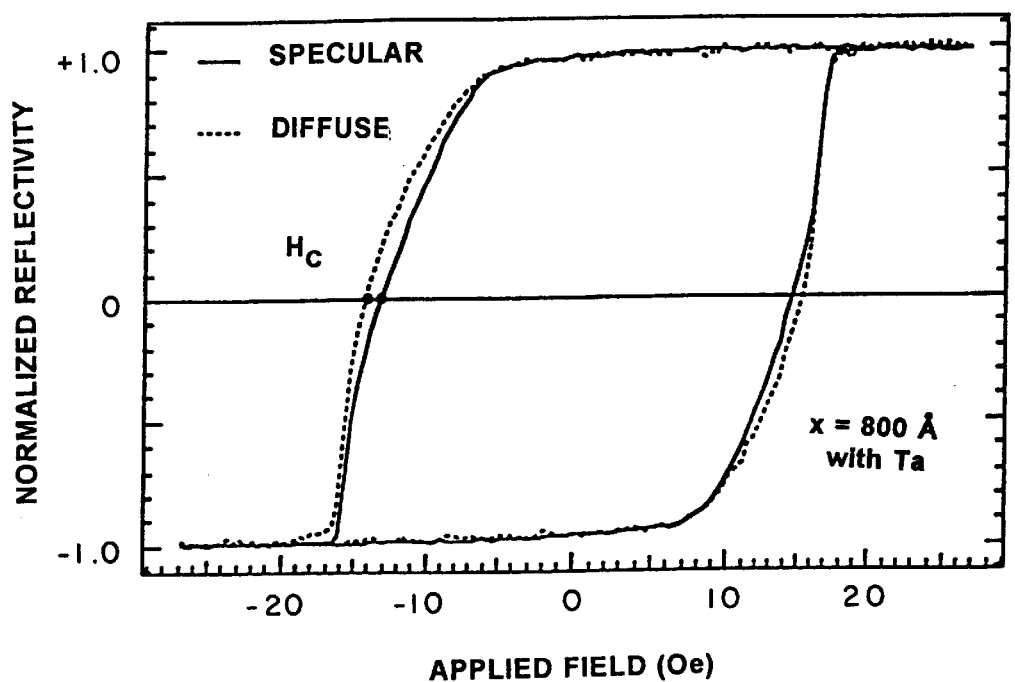
FIG. 2b shows the specular (bulk) and diffuse (interfacial) hysteresis for the 800 Å Cu buffer layer film with a Ta phase-breaking layer taken at the sample angles mentioned in the present specification.

All of the magnetic hysteresis loops were measured with the incident photon energy tuned to the Co $L_3$ edge (778 eV) and detector (2θ) at 10°. The diffuse loops were collected 1° to either side of the specular peak ($\omega=4°$ and 6°). FIGS. 2a and 2b show the specular (bulk) and diffuse (interfacial) hysteresis for the 800 Å Cu buffer layer films with (FIG. 2b) and without (FIG. 2a) the Ta layer. It is evident from these spectra that the interfacial and bulk spins are behaving quite differently. In both cases the coercive fields, $H_c$, are larger for the interfacial spin than the bulk. From an energetics view point, this implies more energy is required to rotate the interfacial moments, which is not surprising since the loss of coordination at the interface will allow these spins to fluctuate more. What is surprising is the shape of the hysteresis loops. The bulk and interfacial loops for films without the phase-breaking Ta layer (FIG. 2a) have the exact same shape while those with the Ta layer (FIG. 2b) are different, indicating that the spins at the interface of the films with the phase-breaking Ta layer experience a qualitatively different magnetic anisotropy field. One explanation is that the modified coordination of interfacial magnetic atoms due to disorder affects the local anisotropy and alters the shape of the hysteresis, similar to random magnetic anisotropy.

Figure 3:
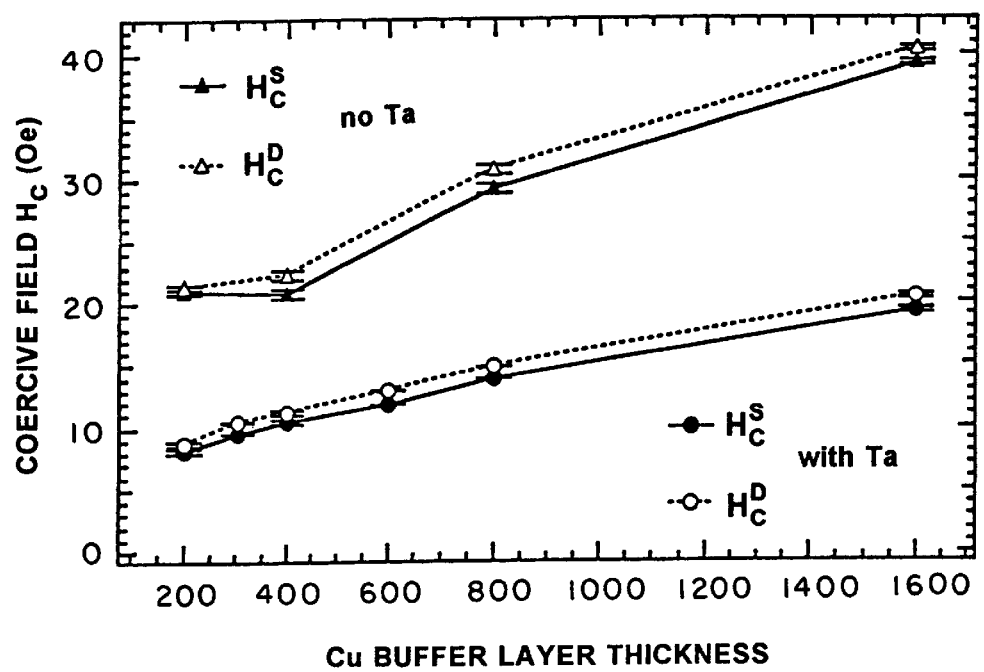
FIG. 3 shows variation of bulk (specular) and interfacial (diffuse) coercive fields (denoted as $H_c^S$ and $H_c^D$) as a function of Cu buffer layer thickness. Solid and open circles denote bulk and interfacial $H_c$, respectively.

The extracted bulk (specular) and interfacial (diffuse) coercive field, denoted as $H_c^S$ and $H_c^D$, as a function of increasing Cu buffer layer thickness (and thus increasing roughness) for the series of samples with and without Ta layers are shown in FIG. 3. For the interfacial $H_c^D$, the value was determined from an average of the two hysteresis loops measured at $\omega=4°$ and 6°. Notice that the differences in the bulk and interfacial coercive field seen in FIGS. 2a and 2b persist over the whole roughness range, indicating that these differences are correlated to the behavior of the chemical and magnetic interfaces. Although it was not mentioned up to this point, roughness obviously affects magnetic properties, as shown in FIG. 3. There is a trend of increasing $H_c$ with increasing rms roughness ($\sigma$), but the reduction of grain size caused by the phase-breaking Ta layer plays an equally important role. At a given roughness, the reduction of grain size (given by chemical (in-plane) correlation length $\xi$) by 35% leads to a factor of two reduction in $H_c$. This is an important result since it implies that by solely engineering the grain size, $H_c$ for these thin film structures can be tailored to the application.

Obviously, many modifications and variations of the present invention are possible in light of the above teachings. It is therefore to be understood that, within the scope of the appended claims, the invention may be practiced otherwise than as specifically described.

What is claimed is:

1. A magnetic structure comprising:
   a first film of nonferromagnetic metal, said first film having a crystalline structure;
   a second film of a ferromagnetic metal, said second film having the same crystalline structure as said first film and lattice spacings within 2% of those of said first film, based upon the lattice spacings of said first film, said second film having a magnetic coercivity;
   a third film of a ferromagnetic metal, said third film having the same crystalline structure as said first film and lattice spacings within 2% of those of said first film, based upon the lattice spacings of said first film, said second film and said third film being made of either the same metals with their relative magnetic coercivities being determined by their respective layer thicknesses, or of different materials having different magnetic coercivities, said first film forming an intervening layer between said second film and said third film;
   a fourth film between said first film and said second film, or between said first film and said third film, said fourth film having:
      a crystalline structure different than that of said first film; or
      the same crystalline structure as said first film with lattice spacings differing by greater than 2% from the lattice spacings of said first film, said second film, and said third film, based upon the lattice spacings of said fourth film.

2. The magnetic structure of claim 1, wherein said fourth film is a metallic conductor or a semiconductor.

3. The magnetic structure of claim 2, wherein said fourth film is selected from the group consisting of Hf, Hf-base crystalline alloys, Zr, Zr-base crystalline alloys, Ti, Ti-base crystalline alloys, Ta, Ta-base crystalline alloys, Fe, Fe-base crystalline alloys, Cr, Cr-base crystalline alloys, semiconductors, and magnetic glasses.

4. The magnetic structure of claim 1, wherein said fourth film is about 1 Å to 100 Å thick.

5. The magnetic structure of claim 1, wherein said first film has a thickness of about 10 Å to about 100 Å and said second and third films also have thicknesses of from 10 Å to about 100 Å.

6. The magnetic structure of claim 5, wherein said fourth film has a thickness of less than or equal to the thickness of said first film and said fourth film also has a thickness of less than or equal to the thickness of said second film and said third film.

7. The magnetic structure of claim 1, wherein said fourth film has been grown upon said first film.

8. The magnetic structure of claim 1, wherein said first film is a nonferromagnetic metal or a nonferromagnetic alloy.

9. The magnetic structure of claim 8, wherein said first film is copper or a copper-base alloy.

10. The magnetic structure of claim 1, wherein said first film, said second film, and said third film have a face-centered cubic crystalline structure and said fourth film has:
    other than a face-centered cubic crystalline structure; or
    a face-centered cubic crystalline structure with lattice spacings differing by greater than 2% from the lattice spacings of said first film, based upon the lattice spacings of said fourth film.

11. The magnetic structure of claim 10, wherein said first film, said second film, and said third film have a face-centered cubic crystalline structure and said fourth film has:
    other than a face-centered cubic crystalline structure; or
    a face-centered cubic crystalline structure with lattice spacings differing by greater than 4% from the lattice spacings of said first film, based upon the lattice spacings of said fourth film.

12. The magnetic structure of claim 11, wherein said fourth film has:
    other than face-centered cubic crystalline structure; or
    face-centered cubic crystalline structure with lattice spacings differing by greater than 6% from the lattice spacings of said first film, based upon the lattice spacings of said fourth film.

13. The magnetic structure of claim 12, wherein said fourth film has:
    other than face-centered cubic crystalline structure; or
    face-centered cubic crystalline structure with lattice spacings differing by greater than 8% from the lattice spacings of said first film, based upon the lattice spacings of said fourth film.

14. The magnetic structure of claim 13, wherein said fourth film has:
    other than face-centered cubic crystalline structure; or
    face-centered cubic crystalline structure with lattice spacings differing by greater than 10% from the lattice spacings of said first film, based upon the lattice spacings of said fourth film.

15. The magnetic structure of claim 14, wherein said fourth film has other than face-centered cubic crystalline structure.

16. The magnetic structure of claim 1, further comprising a fifth film of nonferromagnetic material between said fourth film and said second film or said third film, said fifth film having a thickness of about 5 Å to about 20 Å.

17. The magnetic structure of claim 1, wherein said ferromagnetic metal is selected from the group consisting of Fe, Co, Ni, and alloys thereof.

18. The magnetic structure of claim 17, wherein said ferromagnetic metal is a crystalline CoFe alloy.

19. The magnetic structure of claim 18, wherein said nonferromagnetic metal is Cu or a crystalline Cu-base alloy.

20. A magnetic stack comprising:
    a first set of ferromagnetic films, said first set of ferromagnetic films having a first coercivity, alternating with a second set of ferromagnetic films having a second coercivity lower than that of said films of said first set of ferromagnetic films, so that said films of said first set are separated from each other by a film of said second set and said films of said second set are separated from each other by said films of said first set;
    a third set of non-ferromagnetic film intervening between said films of set first set and said films of said second set, so that said films of said first set and said films of said second set are separated from each other by a film of said third set;
    said first and second set of films having lattice spacings within 2% of the lattice spacing of said third set of films, based upon the lattice spacings of said third set of films; and
    at least one phase-breaking film between a film of said first or second set of films and a film of said third set of films, said phase-breaking film having:
    a crystalline structure different than that of said first film; or
    the same crystalline structure as said first film with lattice spacings differing by greater than 2% from the lattice spacings of said first set of films, said second set of films, and said third set of films, based upon the lattice spacings of said phase-breaking films.

* * * * *